(12) United States Patent
Bhavnagarwala et al.

(10) Patent No.: US 7,397,691 B2
(45) Date of Patent: Jul. 8, 2008

(54) STATIC RANDOM ACCESS MEMORY CELL WITH IMPROVED STABILITY

(75) Inventors: Azeez Bhavnagarwala, Newtown, CT (US); Stephen V. Kosonocky, Wilton, CT (US); Sampath Purushothaman, Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/409,858

(22) Filed: Apr. 24, 2006

(65) Prior Publication Data

US 2007/0247896 A1   Oct. 25, 2007

(51) Int. Cl.
*G11C 11/00* (2006.01)
(52) U.S. Cl. ............... 365/154; 365/194; 257/903
(58) Field of Classification Search .......... 365/154, 365/194; 257/903
See application file for complete search history.

(56) References Cited

U.S. PATENT DOCUMENTS

| | | | | |
|---|---|---|---|---|
| 4,953,127 A | | 8/1990 | Nagahashi et al. ..... | 365/189.05 |
| 5,126,279 A | * | 6/1992 | Roberts .................. | 438/210 |
| 5,166,902 A | | 11/1992 | Silver .................... | 365/182 |
| 5,310,694 A | * | 5/1994 | Houston ................. | 438/153 |
| 5,917,212 A | * | 6/1999 | Blake et al. ............ | 257/300 |
| 6,271,568 B1 | * | 8/2001 | Woodruff et al. ....... | 257/379 |
| 6,756,692 B2 | * | 6/2004 | Hirano et al. .......... | 257/393 |
| 6,901,017 B2 | * | 5/2005 | Shimizu ................. | 365/203 |
| 6,992,916 B2 | * | 1/2006 | Liaw .................... | 365/154 |

* cited by examiner

*Primary Examiner*—Hoai V Ho
(74) *Attorney, Agent, or Firm*—Ryan, Mason & Lewis, LLP

(57) ABSTRACT

A memory cell comprises a wordline, a first digital inverter with a first input and a first output, and a second digital inverter with a second input and a second output. Moreover, the memory cell further comprises a first feedback connection connecting the first output to the second input, and a second feedback connection connecting the second output to the first input. The first feedback connection comprises a first resistive element and the second feedback connection comprises a second resistive element. What is more, each digital inverter has an associated capacitance. The memory cell is configured such that reading the memory cell includes applying a read voltage pulse to the wordline. In addition, the first and second resistive elements are configured such that the first and second feedback connections have resistance-capacitance induced delays longer than the applied read voltage pulse.

17 Claims, 5 Drawing Sheets

STATIC RANDOM ACCESS MEMORY CELL WITH IMPROVED STABILITY

FIELD OF THE INVENTION

The present invention relates to memory cells for use in integrated circuits, and, more particularly, to memory cells for use in static random access memories.

BACKGROUND OF THE INVENTION

A typical six-transistor memory cell used for complementary metal-oxide-semiconductor (CMOS) static random access memories (SRAMs) consists of two cross-coupled digital inverters that combine to store one bit of information, and two access transistors on both sides of the memory cell that connect the memory cell to two bitlines. Typically, the storage state of the memory cell (i.e., "logic 0" or "logic 1") is stored at the output of one of the digital inverters while the output of the other digital inverter is the inverse or complement of this storage state. The access transistors protect the value stored in the memory cell when the memory cell is not being accessed.

FIG. 1 shows a conventional six-transistor CMOS SRAM memory cell 100. The memory cell includes a first digital inverter 110 comprising NFET N1 and PFET P1. This first digital inverter has its input at the connection between the gates of NFET N1 and PFET P1 and its output at storage node S1. The memory cell also includes a second digital inverter 120 comprising NFET N2 and PFET P2 with its input at the connection between the gates of NFET N2 and PFET P2 and with its output at storage node S2. Storage node S1 is connected to the gates of NFET N2 and PFET P2, and storage node S2 is connected to the gates of NFET N1 and PFET P1 in a cross-coupled configuration. During a READ mode operation, bitlines BL1 and BLN 1 are initially precharged to a high logic state voltage (e.g., supply voltage VDD) and then set into a high impedance state. Wordline WL1 is then activated and access transistors N3 and N4 are turned on so that the voltages on the outputs of the digital inverters can be sensed. The digital inverters act to discharge either bitline BL1 or bitline BLN1 to ground depending on the stored state of the memory cell. Thus, in a READ mode operation, the digital inverters in the memory cell drive the bitlines. The state of bitline BL1 and bitline BLN1 are subsequently determined by external logic circuitry to determine the storage state of the memory cell.

To write new data into the memory cell 100, external drivers are activated to drive the bitlines BL1 and BLN1 to the intended storage values for storage nodes S1 and S2 while the wordline WL 1 is set high and the access transistors N3 and N4 are turned on. The voltage on bitline BLN1 will be the complement of the voltage on bitline BL1. Since the external drivers are much larger than the small transistors used in the SRAM memory cell, they easily override the previous state of the cross-coupled digital inverters 110, 120.

It is a goal of SRAM integrated circuit designers and manufacturers to continually reduce the area that a SRAM memory cell occupies on an integrated circuit. In this way, SRAM memory circuitry may be made to perform better and to be produced more inexpensively. Unfortunately, however, the more the size of a conventional SRAM memory cell is decreased, the greater the likelihood that the memory cell will suffer from mismatches in threshold voltages between the CMOS transistors that form the memory cell. The threshold voltage of a CMOS transistor is typically a function of dopant profile, dielectric thickness, trapped charge in the dielectric and other factors. As technology scales down, these factors become increasingly more difficult to control. As a result, significant mismatches can easily occur in the threshold voltages of CMOS transistors within the same SRAM memory cell.

These threshold voltage mismatches may, in turn, cause an instability to occur in the SRAM memory cell during READ mode operations. Assume, for example, that storage node S1 in memory cell 100 is at a low logic state voltage (e.g., ground) and that NFET N1 has an abnormally high threshold voltage while access transistor N3 has an abnormally low threshold voltage. As mentioned before, during a READ mode operation, bitlines BL1 and BLN1 are initially precharged to a high logic state voltage (e.g., VDD) before the wordline WL1 turns on the access transistors N3 and N4. After turning on the access transistors N3, N4, the high threshold voltage of NFET N1 and the low threshold voltage of the access transistor N3 may cause the voltage at storage node S1 to temporarily spike when connected to bitline BL1. This voltage spike may be sufficiently high and fast to flip the stored voltage level at storage node S2 before the value stored at storage node S2 has a chance to be sensed. This causes the SRAM memory cell to lose its proper storage state and a read error to occur. Merely allowing longer read times will not correct this stability problem since the memory cell loses its proper storage state at the beginning of the READ mode sequence.

Other combinations of threshold voltage mismatches can cause similar READ mode operation failures in conventional SRAM memory cells. There is, as a result, a need for a SRAM memory cell design that overcomes these types of failures.

SUMMARY OF THE INVENTION

The present invention addresses the aforementioned need by setting forth a novel SRAM memory cell design that is resistant to READ mode operation instabilities caused by mismatches in threshold voltages among the transistors forming the memory cell. The new memory cell works in part by forming high resistance feedback connections between the digital inverters in the memory cell. Advantageously, these high resistance feedback connections isolate the cell logic from upset events like those described above.

In accordance with an aspect of the invention, a memory cell comprises a wordline, a first digital inverter with a first input and a first output, and a second digital inverter with a second input and a second output. Moreover, the memory cell further comprises a first feedback connection connecting the first output to the second input, and a second feedback connection connecting the second output to the first input. The first feedback connection comprises a first resistive element and the second feedback connection comprises a second resistive element. What is more, each digital inverter has an associated capacitance. The memory cell is configured such that reading the memory cell includes applying a read voltage pulse to the wordline. In addition, the first and second resistive elements are configured such that the first and second feedback connections have respective resistance-capacitance induced delays longer than the applied read voltage pulse.

A memory cell in accordance with an illustrative embodiment of the invention comprises a first digital inverter and a second digital inverter. Each digital inverter, in turn, comprises a p-type field effect transistor (PFET) and an n-type field effect transistor (NFET). The output of the first digital inverter is connected to the input of the second digital inverter by a first feedback connection, and, conversely, the output of the second digital inverter is connected to the input of the first digital inverter by a second feedback connection. The digital inverters are, in this way, cross-coupled. A first bitline is connected to the output of the first digital inverter through a first access transistor and a second bitline is connected to the output of the second digital inverter through a second access transistor. The state of the access transistors is controlled by a wordline. The first and second feedback connections each comprise a resistor. The resistors are sized so that the resistance-capacitance induced delays on the first and second feedback connections are longer than the read voltage pulse applied to the wordline when reading the memory cell.

Advantageously, configuring this memory cell in this way makes the memory cell resistant to READ mode operation instabilities caused by mismatches in threshold voltages among the transistors forming the memory cell. Moreover, it is not necessary to substantially modify conventional READ and WRITE mode operations in order to implement the improved memory cell design.

These and other features and advantages of the present invention will become apparent from the following detailed description which is to be read in conjunction with the accompanying figures.

DETAILED DESCRIPTION OF THE INVENTION

This invention will be illustrated herein in conjunction with an exemplary memory cell for use in integrated circuits. It should be understood, however, that the invention is not limited to the particular materials, elements and features shown and described herein. Modifications to the illustrative embodiment will become apparent to those skilled in the art in light of the following description.

Moreover, it should be understood that only those portions of an integrated circuit required to describe aspects of the invention will be described in detail herein. Circuitry conventionally used in integrated circuits will not be explicitly described for economy of description. This does not imply that the circuitry not explicitly described herein is omitted from an actual integrated circuit when applying aspects of the present invention.

Figure 2:
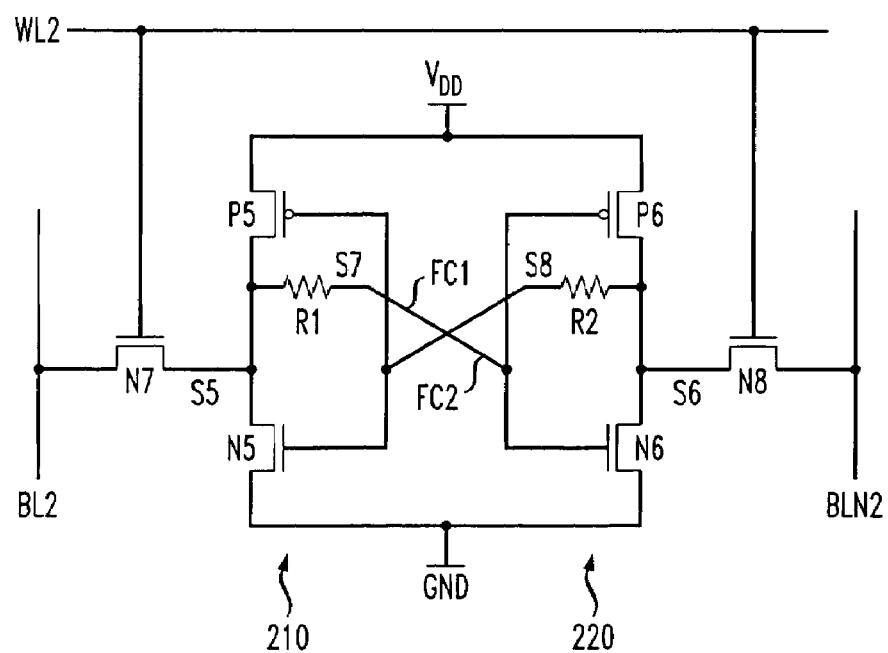
FIG. 2 shows a schematic circuit diagram of a six-transistor SRAM memory cell in accordance with an illustrative embodiment of the invention.

FIG. 2 shows a schematic circuit diagram of a SRAM memory cell 200 in accordance with an illustrative embodiment of the invention. The memory cell includes a first digital inverter 210 comprising NFET N5 and PFET P5. This first digital inverter has its input at the connection between the gates of NFET N5 and PFET P5, and its output at storage node S5. In addition, the memory cell also includes a second logic state inverter 220 comprising NFET N6 and PFET P6 with its input at the connection between the gates of NFET N6 and PFET P6, and its output at storage node S6. Storage node S5 is connected to the gates of NFET N6 and PFET P6 by feedback connection FC1, and storage node S6 is connected to the gates of NFET N5 and PFET P5 by feedback connection FC2. The digital inverters are thereby placed in what is commonly referred to as a "cross-coupled" configuration.

In accordance with an aspect of the invention, feedback connection FC1 comprises a resistor R1 and feedback connection FC2 comprises a resistor R2. Storage nodes S7 and S8 are located in the feedback connections next to the resistors R1 and R2, respectively. What is more, the memory cell 200 further comprises wordline WL2, bitlines BL2 and BLN2, and access transistors N7 and N8.

The high logic state voltage in the memory cell 200 (i.e., the voltage corresponding to a "logic 1" state) is substantially equal to VDD. Conversely, the low logic state voltage (i.e., the voltage corresponding to a "logic 0" state) is substantially equal to the ground potential for the integrated circuit (labeled GND in the figures).

One skilled in the art will recognize that conventional NFETs and PFETs exhibit characteristic gate capacitances at the gate electrodes of these devices. In the particular memory cell 200 shown in FIG. 2, for example, the gate capacitances of NFET N5 and PFET P5 act on the feedback connection FC1, while the gate capacitances of NFET N6 and PFET P6 act on the feedback connection FC2. When these gate capacitances are combined with the resistors R1, R2 in the feedback connections, a resistance-capacitance (RC) delay is induced in these feedback connections. Accordingly, when the voltage at storage node S5 is changed, there is some time delay before storage node S7 changes to the same voltage. The same dynamic occur at storage nodes S6 and S8. Storage nodes S7 and S8 thereby become decoupled in time from storage nodes S5 and S6, respectively.

This inventive decoupling in time of the outputs of the digital inverters 210, 220 from the feedback connectors FC1, FC2 is advantageous. These advantages will now be illustrated in terms of both READ and WRITE mode operations in the memory cell 200.

Figure 3:
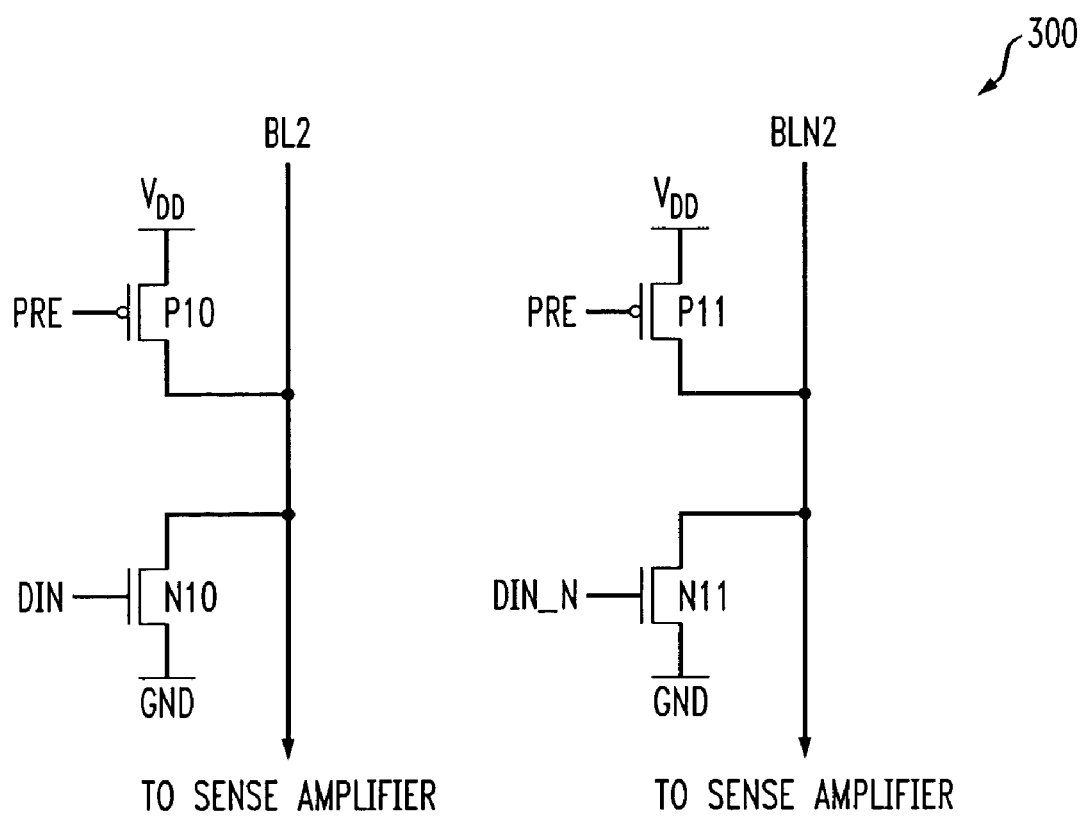
FIG. 3 shows a schematic circuit diagram of a bitline conditioning circuit used in conjunction with the FIG. 2 SRAM memory cell.

Both READ and WRITE mode operations in the memory cell 200 utilize a bitline conditioning circuit. Illustrative bitline conditioning circuit 300 is shown in FIG. 3. The bitline conditioning circuit includes PFET P10 whose drain is connected to bitline BL2, and PFET P11 whose drain is connected to bitline BLN2. The sources of both PFET P10 and PFET P11 are connected to VDD while the gates of these devices are connected to precharge signal PRE. NFET N10 has its source connected to BL2 and NFET N11 has its source connected to BLN2. The drains of both NFET N10 and NFET N11 are connected to ground. The gate of NFET N10 is connected to signal DIN and the gate of NFET N11 is connected signal DIN_N.

Figure 4:
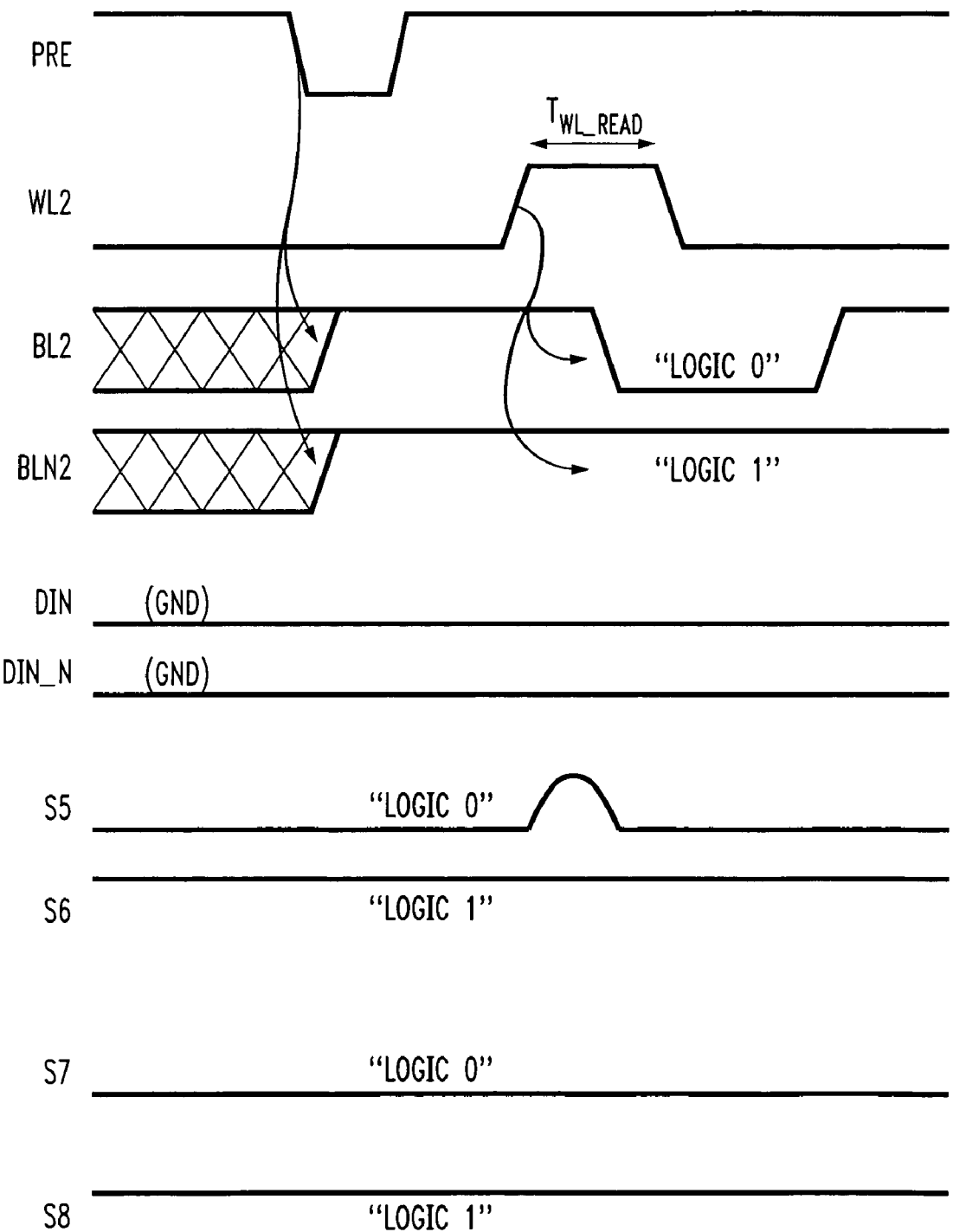
FIG. 4 is a timing diagram showing the waveforms of various signals in the FIG. 2 SRAM memory cell during a READ mode operation.

FIG. 4 shows a timing diagram of a READ mode operation in the memory cell 200. In FIG. 4 the memory cell is configured to store a "logic 0" value (i.e., the memory cell is configured such that storage node S5 is at or near a ground voltage and storage node S6 is at or near VDD), but the reading of a "logic 1" is accomplished in a similar way. As shown in the figure, the READ mode operation is initiated by charging ("precharging") bitline BL2 and bitline BLN2 to VDD. This precharging is accomplished by temporarily setting precharge signal PRE to a low logic state voltage and thereby turning on PFET 10 and PFET P11 in the bitline conditioning circuit 300.

Subsequently a pulse of voltage of a duration $T_{WL\_READ}$ ("read voltage pulse") is applied to the wordline WL2 causing the wordline to temporarily assume a high logic state voltage. Access transistors N7 and N8 are thereby turned on, connecting the output of the first digital inverter 210 at storage node S5 to bitline BL2 and connecting the output of the second digital inverter 220 at storage node S6 to bitline BLN2. As shown in FIG. 4, these connections drive bitline BL2 to ground while BLN2 remains at VDD. During the entire READ mode operation, the signal DIN and signal DIN_N remain at low logic state voltages. The difference between the voltages on the bitlines BL2 and BLN2 are subsequently sensed by the sense amplifier and the storage state of the memory cell 200 is determined.

Figure 5:
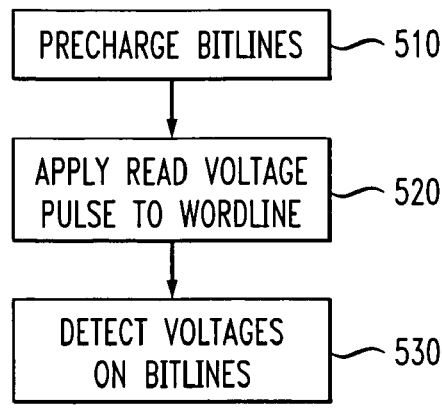
FIG. 5 shows a flow chart for a READ mode operation in the FIG. 2 memory cell.

FIG. 5 shows a flow-chart summarizing the above-described READ mode operation in the memory cell 200. In step 510, the bitlines BL2, BLN2 are precharged. Next, in step 520, a read voltage pulse is applied to the wordline WL2. In step 530, the voltages on the bitlines are detected and the storage state of the memory cell is determined.

The duration of the read voltage pulse, $T_{WL\_READ}$, for READ mode operations is defined by peripheral circuitry (not shown). In accordance with an aspect of the invention, the duration of the read pulse voltage is defined to be smaller than the RC delays of the signal path between storage nodes S5 and S7 and between storage nodes S6 and S8. The reasons for this sizing will be described below.

Figure 1:
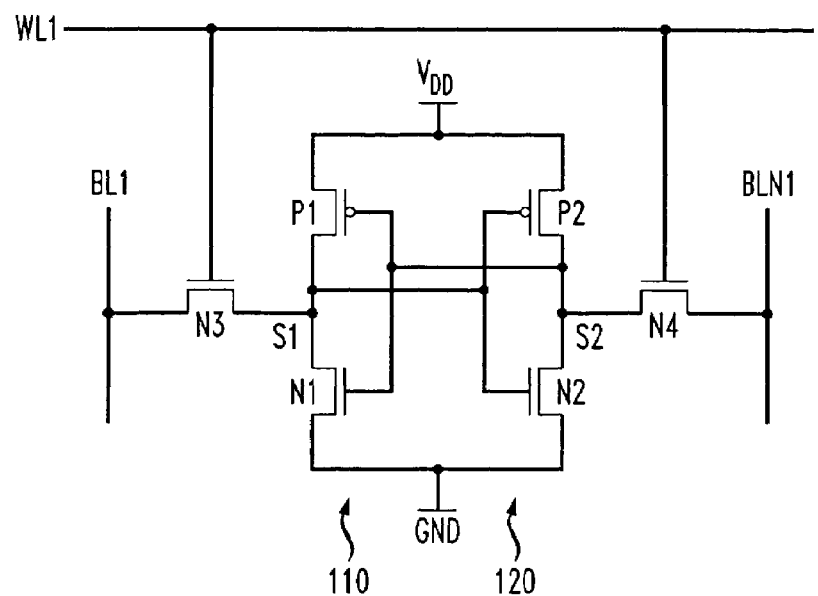
FIG. 1 shows a schematic circuit diagram of a conventional six-transistor SRAM memory cell.

One skilled in the art will recognize that the READ mode operation shown in FIGS. 4 and 5 is similar to that performed in a conventional SRAM memory cell like memory cell 100 in FIG. 1. Nonetheless, the memory cell 200 shows a much greater resistance to READ mode operation instabilities caused by fluctuations in threshold voltages than a conventional memory cell. The speed at which a NFET or PFET transmits charge is dependent on the transistor's threshold voltage. A relatively high threshold voltage typically results in a relatively slow device and, conversely, a relatively low threshold voltage typically results in a relatively fast device. If, for example, access transistor N7 in the memory cell 200 has a relatively low threshold voltage (i.e., it is relatively fast) and NFET N5 has a relatively high threshold voltage (i.e., it is relatively slow) when compared to the other transistors in the memory cell, the voltage at the output of the first digital inverter 210 at storage node S5 may spike when the read voltage pulse is first applied to the wordline WL2. Such a voltage spike is shown in FIG. 4. While the storage node S5, given sufficient time, eventually achieves the proper voltage state, such a voltage spike on the output of a digital inverter in a conventional SRAM memory cell like memory cell 100 would likely cause the conventional memory cell to lose its storage state and a read error to occur. This disadvantage can be avoided by one or more exemplary embodiments of the invention.

As described above, storage node S7 in the memory cell 200 is decoupled in time from storage node S5 because of the RC delay in the first feedback connection FC1. Moreover, as further described above, the RC delay on the first feedback connection is fixed at a time longer than the time necessary to read the memory cell. As a result, storage node S7 will not incur a voltage spike like storage node S5, if at all, until after the read voltage pulse has been completed and the state of the memory cell has been accurately determined. Advantageously, the memory cell 200, therefore, becomes resistant to the kinds of threshold voltage mismatches that can cause errors in conventional SRAM memory cells.

It will be noted that while the above advantages of the present invention were illustrated with the memory cell 200 having the access transistor N7 with a relatively low threshold voltage and having the NFET N5 with a relatively high threshold voltage, the advantageous aspects of one or more embodiments of the present invention are not limited to this particular situation. Implementation of aspects of the invention will benefit any SRAM memory cell having a threshold voltage mismatch between its transistors that causes the output of one of the memory cell's digital inverters to undergo a voltage spike at the beginning of a READ mode operation.

Figure 6:
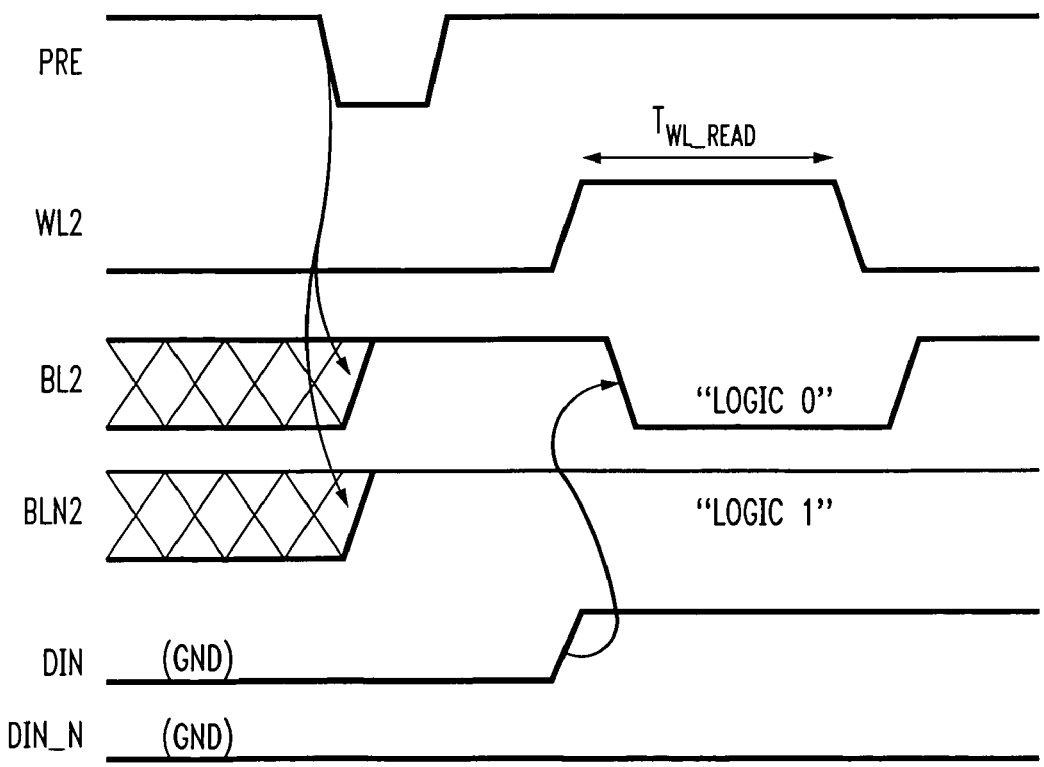
FIG. 6 is a timing diagram showing the waveforms of various signals in the FIG. 2 SRAM memory cell during a WRITE mode operation.

The WRITE mode operation in the memory cell 200 shown in FIG. 2 is also performed in a manner similar to a conventional SRAM memory cell (e.g., memory cell 100). FIG. 6 shows the timing diagram of the WRITE mode operation for writing a "logic 0" to the memory cell. It should be noted, however, that writing a "logic 1" to the memory cell would be accomplished in a similar fashion.

Like a READ mode operation, the WRITE mode operation is preceded by precharging bitlines BL2 and BLN2 to VDD. This precharging is accomplished by temporarily setting precharge signal PRE to a low logic state voltage and thereby turning on PFET P10 and PFET P11 in the bitline conditioning circuit 300.

Next, the signal DIN is set to a high logic state voltage and a write voltage pulse of duration $T_{WL\_WRITE}$ is applied to the wordline WL2. As a result of the high DIN signal, NFET N10 in the bitline conditioning circuit 300 is turned on and the bitline BL2 is correspondingly driven to the ground voltage. The voltages on the bitlines BL2, BLN2 override the previous states of the cross-coupled inverters 210, 220. In this way, the output of the first inverter 210 at storage node S5 is set to a low logic state voltage (i.e., a voltage at or near ground) and the output of the second inverter 220 at storage node S6 is set to a high logic state voltage (i.e., a voltage at or near VDD).

Figure 7:
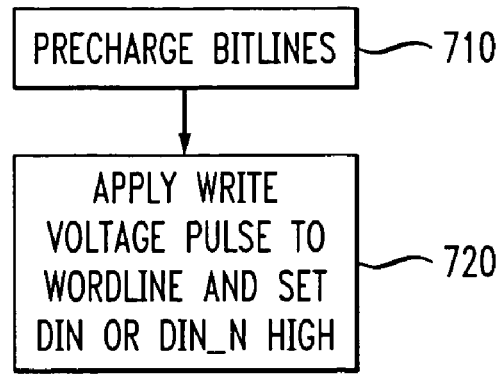
FIG. 7 shows a flow chart for a WRITE mode operation in the FIG. 2 memory cell.

FIG. 7 shows a flow-chart summarizing the above-described WRITE mode operation in the memory cell 200. In step 710, the bitlines BL2, BLN2 are precharged. Next, in step 720, a write voltage pulse is applied to the wordline WL2 and signal DIN (or DIN_N depending on the desired storage state) is set to a high logic state voltage.

Notably, in accordance with an aspect of the invention, the write voltage pulse width $T_{WL\_WRITE}$ for WRITE mode operations is sized to be longer than the RC delays of the signal paths between storage nodes S5 and S7 and storage nodes S6 and S8. The write voltage pulse width, therefore, may be substantially longer than that used in conventional SRAM memory cells. This longer write voltage pulse in the memory cell 200 allows the data to be properly written to storage nodes S7 and S8 before the wordline WL2 is deactivated.

The memory cell as described above is part of the design for an integrated circuit chip. The chip design is created in a graphical computer programming language, and is stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips can be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product can be any product that includes integrated circuit chips, ranging from toys and other low-end applications to advanced computer products having a display, a keyboard or other input device, and a central processor.

Figure 8:
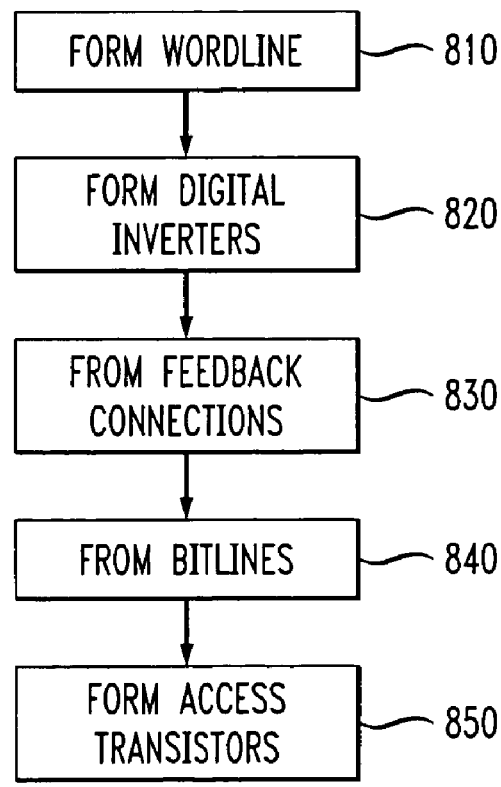
FIG. 8 shows a flow chart for forming the FIG. 2 memory cell.

FIG. 8 shows a flow chart for forming the illustrative memory cell 200. Advantageously, the memory cell can be formed on an integrated circuit chip using predominantly conventional semiconductor processing methods. The design and forming of physical circuitry in an integrated circuit corresponding to the schematic circuit diagram shown in FIG. 2 will be familiar to one skilled in the art. Moreover, the design and processing of integrated circuits is demonstrated, for example, by the reference books: S. Wolf and R. N. Tauber, *Silicon Processing for the VLSI Era, Volume* 1: *Process Technology*, Lattice Press, 1986, and S. Wolf, *Silicon Processing for the VLSI Era, Volume* 2: *Process Integration*, Lattice Press, 1990. The wordline WL2 is formed in step 810, the digital inverters 210,220 are formed in step 820, and the feedback connections FC1, FC2 are formed in step 830. What is more, the bitlines BL2, BLN2 are formed in step 840 and the access transistors N7, N8 are formed in step 850. It will be appreciated, however, that, given the teachings herein, the steps can be performed in any appropriate order and any desired degree of overlap.

The wordline WL2 may comprise doped polysilicon while the bitlines BL2, BLN2 comprise metals such as tungsten, aluminum or copper. Resistors R1 and R2 may be formed using integrated circuit metallization features comprising metal nitrides, metal oxynitrides, metal oxides or metal silicides such as, but not limited to, tungsten nitride, tantalum silicon nitride, tantalum silicon oxynitride, tungsten oxynitride, ruthenium oxide or nickel silicide. Moreover, the resistors may be formed in dopant implanted regions of the integrated circuit substrate. Once the material for a resistor feature is chosen, the electrical resistance of the resistor feature can be tailored by adjusting its dimensions and by the placement of the electrical contacts that contact the resistor feature. Again, the formation of resistor features in integrated circuits is conventionally performed when forming integrated circuits and will, therefore, be familiar to one skilled in the art.

Although an illustrative embodiment of the present invention have been described herein with reference to the accompanying figures, it is to be understood that the invention is not limited to those precise embodiments, and that various other changes and modifications can be made to these embodiments by one skilled in the art without departing from the scope of the appended claims.

What is claimed is:

1. A memory cell comprising:
   a wordline;
   a first digital inverter, the first digital inverter including a first input and a first output, at least the first input having a capacitance;
   a second digital inverter, the second digital inverter including a second input and a second output, at least the second input having a capacitance;
   a first feedback connection, the first feedback connection connecting the first output to the second input and comprising a first resistive element; and
   a second feedback connection, the second feedback connection connecting the second output to the first input and comprising a second resistive element;
   wherein the memory cell is configured such that reading the memory cell includes applying a read voltage pulse to the wordline, and the first and second resistive elements are configured such that the first and second feedback connections have respective resistance-capacitance induced delays longer than the applied read voltage pulse.

2. The memory cell of claim 1, wherein the memory cell comprises complementary metal-oxide-semiconductor circuitry.

3. The memory cell of claim 1, wherein at least one of the first and second digital inverters comprises an n-type field effect transistor and a p-type field effect transistor.

4. The memory cell of claim 1, wherein the memory cell further comprises:
   a first bitline;
   a first access transistor, the first access transistor connecting the first bitline to the first output;
   a second bitline; and
   a second access transistor, the second access transistor connecting the second bitline to the second output.

5. The memory cell of claim 4, wherein the first and second access transistors are operative to be switched on and off by the wordline.

6. The memory cell of claim 4, wherein at least one of the first and second access transistors comprises an n-type field effect transistor.

7. The memory cell of claim 4, wherein the first and second bitlines are configured to be charged to a high logic state voltage before reading the memory cell.

8. The memory cell of claim 4, wherein at least one of the first and second bitlines comprises tungsten, aluminum or copper, or a combination thereof.

9. The memory cell of claim 1, wherein the memory cell is configured such that writing to the memory cell includes applying a write voltage pulse to the wordline, and the write voltage pulse is longer than the resistance-capacitance induced delays of the first and second feedback connections.

10. The memory cell of claim 1, wherein at least one of the first and second resistive elements comprises metal nitride, metal oxynitride or metal oxide.

11. The memory cell of claim 1, wherein at least one of the first and second resistive elements comprises metal silicide.

12. The memory cell of claim 1, wherein at least one of the first and second resistive elements comprises doped silicon.

13. The memory cell of claim 1, wherein the wordline comprises polysilicon.

14. An integrated circuit comprising a plurality of memory cells, at least one of the plurality of memory cells comprising:
   a wordline;
   a first digital inverter, the first digital inverter including a first input and a first output, at least the first input having a capacitance;
   a second digital inverter, the second digital inverter including a second input and a second output, at least the second input having a capacitance;

a first feedback connection, the first feedback connection connecting the first output to the second input and comprising a first resistive element; and a second feedback connection, the second feedback connection connecting the second output to the first input and comprising a second resistive element;

wherein the memory cell is configured such that reading the memory cell includes applying a read voltage pulse to the wordline, and the first and second resistive elements are configured such that the first and second feedback connections have respective resistance-capacitance induced delays longer than the applied read voltage pulse.

15. The integrated circuit of claim 14, wherein the integrated circuit comprises static random access memory circuitry.

16. The integrated circuit of claim 14, wherein the at least one of the plurality of memory cells is configured such that writing to the at least one of the plurality of memory cells includes applying a write voltage pulse to the wordline, and the write voltage pulse is longer than the resistance-capacitance induced delays of the first and second feedback connections.

17. The integrated circuit of claim 14, wherein the at least one of the plurality of memory cells further comprises:
  a first bitline;
  a first access transistor, the first access transistor connecting the first bitline to the first output;
  a second bitline; and
  a second access transistor, the second access transistor connecting the second bitline to the second output.

* * * * *